United States Patent [19]

Belanger et al.

[11] Patent Number: 4,617,160

[45] Date of Patent: Oct. 14, 1986

[54] METHOD FOR FABRICATING MODULES COMPRISING UNIFORMLY STACKED, ALIGNED CIRCUIT-CARRYING LAYERS

[75] Inventors: Robert J. Belanger, Costa Mesa; Alan G. Bisignano, Anaheim, both of Calif.

[73] Assignee: Irvine Sensors Corporation, Costa Mesa, Calif.

[21] Appl. No.: 674,096

[22] Filed: Nov. 23, 1984

[51] Int. Cl.⁴ .................. H01L 21/70; H01L 21/90
[52] U.S. Cl. .................. 264/40.1; 29/572;
29/576 J; 29/577 C; 29/830; 29/834; 156/64;
156/245; 156/288; 156/289; 156/307.3;
156/307.7; 156/360; 156/378; 156/379;
264/263; 264/272.15; 264/272.17; 269/303;
269/319; 425/383; 250/578
[58] Field of Search .............. 156/64, 228, 245, 288,
156/289, 307.7, 307.3, 360, 378, 379; 29/572,
576 J, 577 C, 830, 834; 264/40.1, 263, 272.15,
272.17; 425/383, 352; 269/303, 319; 250/578

[56] References Cited

U.S. PATENT DOCUMENTS

| | | | |
|---|---|---|---|
| 3,284,884 | 11/1966 | Prazak | 269/319 |
| 4,128,235 | 12/1979 | Gersbacher | 269/303 |
| 4,186,916 | 2/1980 | Varga | 269/303 |
| 4,342,090 | 7/1982 | Caccoma et al. | 29/834 |
| 4,506,442 | 3/1985 | Alzmann et al. | 29/830 |
| 4,525,921 | 7/1985 | Carson et al. | 29/577 C |
| 4,536,239 | 8/1985 | Benson | 156/378 |
| 4,551,629 | 11/1985 | Carson et al. | 29/572 |

*Primary Examiner*—Jerome Massie
*Attorney, Agent, or Firm*—Thomas J. Plante

[57] ABSTRACT

A method and related fixtures are disclosed which permit formation of stacks of thin circuitry-carrying layers. The layers terminate in an access plane having a two dimensional array of closely-spaced electrical leads. The method includes the steps of measuring the thickness of separate chips, selecting groups of chips having appropriate thicknesses, applying appropriate amounts of epoxy between adjacent chips, aligning the chips (and their electrical leads) in the direction parallel to their planes (i.e., the X-axis), and closing the cavity with an end wall which (a) exerts pressure on the stacked chips and epoxy in a direction perpendicular to the chip planes, and (b) establishes a fixed height of the stack in order to align the leads in the Y-axis. The final fixture provides a fixed-size cavity for confining the layers during curing of thermo-setting adhesive which has been applied between each adjacent pair of layers. An initial fixture is provided for accurately measuring the thickness of each layer under substantial layer-flattening pressure. An intermediate fixture is provided for wet stacking the layers prior to their insertion into the final fixture.

14 Claims, 21 Drawing Figures

METHOD FOR FABRICATING MODULES COMPRISING UNIFORMLY STACKED, ALIGNED CIRCUIT-CARRYING LAYERS

BACKGROUND OF THE INVENTION

This invention is intended to solve certain problems involved in building layered structures incorporating high-density electronic circuitry.

U.S. Pat. Nos. 4,525,921, issued July 2, 1985, and 4,551,629, issued Nov. 5, 1985, both assigned to the assignee of this application, disclose the use of modules containing stacks of semiconductor (e.g., silicon) chips, each of which carries integrated circuitry having a large number of closely-spaced, independent electrical leads exposed at the end of the chip. The stacked chips thus provide a three-dimensional laminated structure, having on one end surface (formed by the ends of the laminations) a mosaic of separate electrical leads, whose total number is the product of the number of chips in the stack times the number of leads on each chip.

Because the numerous leads are very closely spaced, but require independent connections to external elements, such as sensors (e.g., photo-detectors), or lead-out terminals, the subsequent ability to align the leads with their individual contact elements, while avoiding any short circuits, requires that extremely tight tolerances be maintained in positioning the leads on the surface of the module. During stacking of the chips to form a unitary structure, misalignment can occur both parallel to, and perpendicular to, the planes in which the chips extend. The latter problem has been particularly difficult to solve.

In general, the purpose of the present invention is to provide a stack of chips, or other substrates, whose electrical leads are aligned within close tolerances, which in some instances may be as close as a tolerance of 0.0005 in. in the X-axis (parallel to the chip plane), and a tolerance of 0.001 in. in the Y-axis (perpendicular to the chip plane). Alignment in the X-axis is a function of the accuracy of the cutting of individual chips from the wafer. Alignment in the Y-axis is a function of the thickness of the bonding material between adjacent chips and of the thickness of each chip.

SUMMARY OF THE INVENTION

The present invention provides a fixture in which a stack of circuit-carrying layers (preferably semiconductor chips) is confined during curing of adhesive layers (preferably epoxy) which are formed between the substrate layers. Key aspects of the novel fixture disclosed in this application are: (a) providing in the fixture a stack-confining space which confines the stacked layers to a predetermined height, and which provides reference elements to which the chips are butted to achieve X-axis alignment; and (b) building the walls, or confining elements, of the fixture with material having a coefficient of thermal expansion similar to that of the layer material.

The present invention also relates to a method comprising the steps of measuring the thickness of separate chips, selecting groups of chips having appropriate thicknesses, applying appropriate amounts of epoxy between adjacent chips, aligning the chips (and their electrical leads) in the direction parallel to their planes (i.e., the X-axis), and closing the cavity with an end wall which (a) exerts pressure on the stacked chips and epoxy in a direction perpendicular to the chip planes, and (b) establishes a fixed height of the stack in order to align the leads in the Y-axis.

BRIEF DESCRIPTION OF THE DRAWINGS

FIGS. 4A and 4B show a chip-measuring fixture, which may be used to measure the chips, or substrates, both individually and in a dry stack containing a plurality of chips; FIG. 4A showing (in reduced dimensions) the exterior of the complete fixture, including a transducer used as a measuring gauge; and FIG. 4B showing (in enlarged dimensions) a vertical plane cross-section through the chip-containing cylinder/piston structure.

DETAILED DESCRIPTION OF PREFERRED EMBODIMENT

Figures 1, 2, 3:
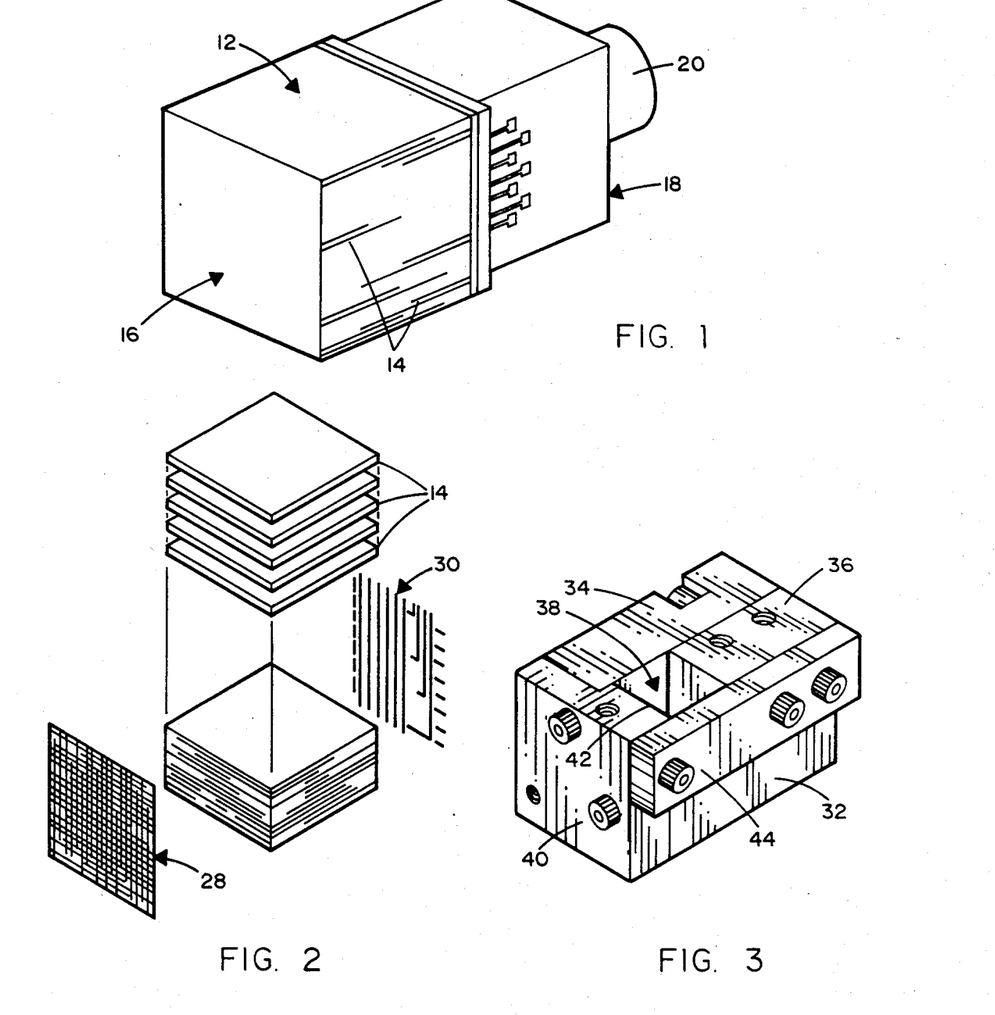
FIG. 1, which is substantially identical with FIG. 1 of each of the earlier applications listed above, is an isometric view of a completed structure comprising a stack of chips, or substrates, each carrying electronic circuitry, and secured to a supporting member which might be used to mount the stack in a focal plane assembly.
FIG. 2 is an isometric, partially exploded view of the stack of FIG. 1.
FIG. 3 is an isometric view of a "fixed cavity" lamination fixture which is used during curing of the epoxy between adjacent layers of the stack, the fixture lacking only the final wall which is secured to the top of the fixture to completely close the cavity prior to the curing process.

FIG. 1 shows a stack 12 comprising a multiplicity of layers 14, each of which is a semiconductor chip (preferably silicon) which carries an integrated circuit having suitable electrical leads terminating at an access plane 16 which, in a photo-detector device, is a front, or focal, plane, on which such leads may be in electrical contact with separate, very-closely-spaced photo-detectors. The stack 12 is, in effect, a "sandwich", or laminated structure, comprising numerous silicon chips, or substrates, secured together by suitable adhesive material between adjacent chips. The shape of the stack may be described as a rectangular parallelepiped, because each of its surfaces is rectangular. In some cases it may be essentially cubic. The stack of chips may be mounted on a supporting block 18, which also functions as a heat-transfer, or cooling, structure, and which may have a mounting stud 20 for use in securing the stack and its supporting block in a larger assembly. Generally, the combination of the stack of silicon chips and the supporting block is considered to be a module assembly.

Referring now to FIG. 2, which is an exploded view of stack 12, it is seen that it includes separately formed silicon chips 14 which, after being stacked and glued together, are provided on their front, or focal, access plane with a detector "mosaic" 28, and on their rear, or back, access plane with back plane wiring 30.

The present invention deals with the extremely severe requirements of accurately forming the stack of chips, or substrates, so that the electrical leads, particularly those on the front plane, will be properly spaced from one another. The requirements, which have been encountered in providing focal plane modules, might also be encountered in other situations where densely-packed electronic circuitry requires access plane connection (to separate contact elements) of very closely spaced electrical leads (i.e., on centers which could be as close as 0.002 to 0.004 inch).

For greater ease in the following description, placing and retaining the chips in position in the direction parallel to the planes of the chips is referred to as X-axis alignment; and placing and retaining the chips in position in the direction perpendicular to the planes of the chips is referred to as Y-axis alignment. X-axis alignment holds the electrical leads on the multiplicity of stacked chips in straight "vertical" lines; the correct "horizontal" spacing of such lines depends on accurate forming of the integrated circuitry on the chips. The correct "vertical" spacing of the electrical leads in a given vertical line depends on having the active surfaces of the chips essentially equally spaced.

Numerous earlier efforts to manufacture modules comprising stacked chips were carried out. Initial module building utilized a fixture that squeezed the cube, making "Y" alignment a function of chip and glueline thickness. A "Y" alignment problem existed with this fixture because the stack height could not be controlled.

After extensive analysis and experimentation, it appears that the stacked chips must be confined in a "fixed cavity", or stack-confining structure during the process in which the glue, or epoxy, is cured. In other words, the internal walls, or other position reference elements, of the fixture should provide a predetermined height into which the stacked layer module fits, and may also provide a predetermined volume.

It also appears that the confining walls, or position reference elements, which define the cavity, or stack-confining space, should be formed of material having a thermal coefficient of expansion as close as possible to that of the chip material. The preferred material for this purpose would be molybdenum, which has a thermal expansion coefficient of approximately $4.9 \times 10^{-6}$ inch/inch/°C., whereas the thermal expansion coefficient of silicon chips is approximately $4.2 \times 10^{-6}$ inch/inch/°C. Kovar, which has a thermal expansion coefficient of $6 \times 10^{-6}$ inch/inch/°C., has been used because it is more readily available.

At one time, it was considered desirable to include small pieces of resilient material, such as rubber, as "bumpers" in the fixed cavity structure, in order to maintain X-axis alignment pressure on the chips during the curing process. However, this technique was abandoned, primarily because the reaction of the rubber to heat during curing tended to hinder Y-axis alignment.

A rather elaborate method appears to be useful in obtaining the desired results. This method, in its present form, uses three separate fixtures for working with the chips.

Before the details of the method are described, attention is called to the fixed cavity structure shown in FIG. 3. In that figure, the cavity is closed, except for a final side bar (not shown). A total of six wall-providing members are used in the complete cavity of FIG. 3, although it is possible to omit two of the six walls. A platform member 32 supports, and is secured by suitable clamping screws to, two "block-shaped" members—a longer block member 34, and a shorter block member 36.

After the stacked chips have been suitably installed in the cavity 38, three additional walls are added. One of them is provided by a cap member 40, which is secured to the platform 32 and block member 34, and which has a raised portion 42 on its inner wall pressing against the flat surfaces of the chips, i.e., exerting pressure perpendicular to the planes of the chips. The final two sides may be closed by two side-bar members, one of which is shown at 44. Each side-bar member is secured to the block member 36, and also to the cap member 40. Because the position of cap member 40 is changed as pressure on the stack is increased, the clamping screw which holds each side bar member to the cap member should extend through an appropriately widened slot in the body of the side-bar.

The chips, or substrates, are normally formed by slicing them from wafers of suitable material. The present preference is the semiconductor material silicon, but other substrate materials might be used. The wafer is initially lapped to provide the desired chip thickness, and to provide identical chip thickness throughout (as tightly controlled as possible). However, analysis and experience have demonstrated that the thickness and flatness of individual chips will vary enough to create major problems in the stacking process.

The general practice is to form the integrated circuitry on the wafer, lap and polish the wafer down to the appropriate thickness, and then slice each wafer into, say, 36 IC chips. After cleaning, the individual chips intended for a given module are microscopically examined to detect and eliminate any flawed chips. Then the thickness of each chip is measured, under carefully calibrated conditions. The measurement of individual chips permits a selection, preferably using computer-stored thickness and conductor-edge-distance data, of the optimum stacking order for maintaining the electrical lead position tolerance. In other words, a chip slightly over the nominal thickness might be stacked next to a chip slightly under the nominal thickness, in order to avoid a build-up of position deviation.

Figure 4A:
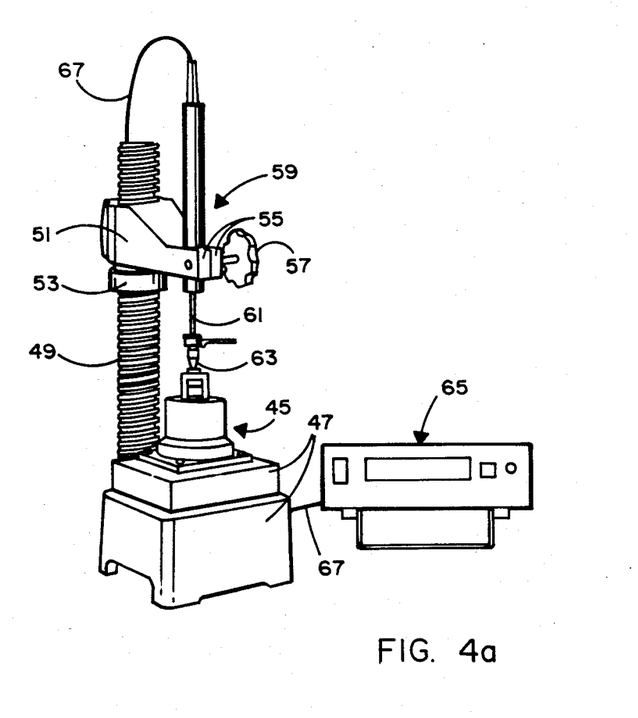
Figure 4B:
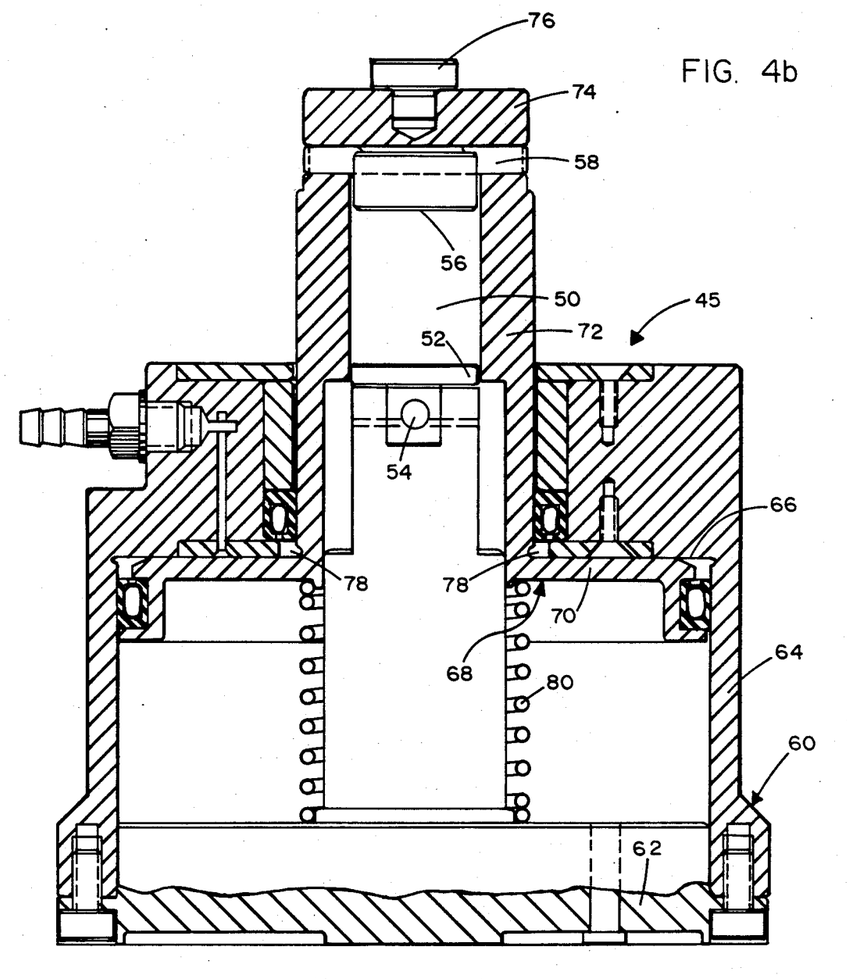

The fixture used for measurement of chip thickness, both of individual chips and of dry stacked chips (i.e., without epoxy) is shown in FIGS. 4A and 4B. This apparatus is a pressure-operated device which is designed to measure the chips under a predetermined optimum pressure, thus avoiding loss of dimensional reliability. The same pressure may also be used in subsequent process steps. The disclosed chip thickness measuring process is capable of measuring them to an accuracy of 0.0001 inch.

The individual chips tend to have two primary deviations from perfect flatness and consistent thickness. A chip may have a slightly concave shape, which tends to provide a different thickness measurement if it is pushed into a flatter shape. Or a chip may have a shape which is thicker at one point than another, providing a somewhat wedge-shaped effect in cross-section.

The apparatus of FIGS. 4A and 4B is designed to accommodate both of these deviations. The solution of the concavity problem is to measure and stack the chips under pressure which is sufficient to essentially flatten them, while minimizing the possibility of damaging them. The solution of the wedge-shaped problem is to provide pivoted supporting pads in the apparatus which permit self-leveling of the chips under pressure, thus avoiding damage where the chips cannot be safely flattened.

As shown in FIG. 4A, a fixture 45 is supported on a stand 27, which also supports a threaded column 49. A vertically adjustable arm 51 has one end secured to an internally-threaded collar 53 engaging the threaded column 49 to permit vertical adjustment of the collar and arm. The other end of arm 51 has bifurcated clamping extensions 55 which are loosened or tightened by a threaded stem controlled by a knob 57. The extensions 55 clamp in position a suitable dimension-measuring gauge. A Sony DZ-500 digital gauge has proved suitable for this purpose. It comprises an outer tube 59, in which is telescopically mounted a spring loaded plunger 61, which carries at its lower end a tip 63 adapted to engage a gauge button on the top of fixture 45.

The gauge is a transducer which provides a digital readout of the measured dimension on a meter 65, which receives its electrical control signal via wire 67. In making a measurement, the initial readout is reset to zero when the fixture 45 is in its initial "empty" position.

As shown in FIG. 4B, a receptacle 50 at the top of fixture 45 is provided in which the individual, or stacked, chips are inserted for measurement. The chip, or chip stack, is supported on a self-leveling platform, or pad, 52 which is pivotally associated with a pin 54, the axis of which extends perpendicular to the plane of the drawing, as seen in FIG. 4B. The top of the chip, or chip stack, is engaged, and placed under downwardly-acting pressure, by a self-leveling pad 56 which is pivotally associated with a pin 58, the axis of which extends parallel to the plane of the drawing, as seen in FIG. 4B. The rectilinear relationship of the axes of pins 54 and 58 permits leveling of the chips under pressure.

The fixture 45 may be an air pressure cylinder and piston combination, in which a cylinder housing 60 is bolted to a stationary base 62, and comprises a vertically-extending cylindrical wall 64, and an upper piston-travel-limiting wall 66. A piston, or diaphragm, 68 is adapted to reciprocate vertically in the cylinder, and comprises a pressure-responsive movable wall 70, a vertically-extending skirt portion 70 which extends alongside the chip(s), and a cap 74 which carries a gauge button 76 in contact with the tip 63 of the digital gauge. This arrangement permits accurate and precise comparable thickness measurements of the chip(s).

Downward motion of piston 68 inside cylinder housing 60 is caused by admitting air (or other fluid) under pressure into the chamber above the piston. Initially, the compressed air enters above the movable wall 70, and then fills the space above the movable wall as the latter is forced downwardly. Until compressed air is admitted to chamber 78, the movable wall is held in its uppermost, or retracted, position by a compression spring 80.

The pressure at which chip measurement is preferably made is approximately 600 psi, which represents a total force of approximately 150 lbs. on the chip. While this may seem quite high, and while some chip damage is incurred, experience indicates that a relatively high pressure is required for eventual alignment accuracy. Using the same pressure throughout is vital, because it ensures comparability and consistency of the thickness data.

The selection of chips for use in the stack is based partly on their conformity to the desired thickness and partly on microscopic inspection of their circuitry. The yield at present, i.e., the percentage of chips suitable for module stacking, may run as low as 5% of the chips originally cut from the wafers. This yield percentage should improve as the I C vendors are able to improve thickness and circuitry consistency.

After the individual chips have been measured, a preferred order of chip stacking is determined, using the computer-stored chip thickness data. Then a dry stacking of chips is performed, using the apparatus of FIGS. 4A and 4B. During this dry stacking, a measurement is taken after each successive chip is added to the stack, in order to compare the actual dimensions to the predicted dimensions. All of these measurements are taken with the same pressure on the chips, i.e., approximately 600 psi. If the measured dimensions do not conform to those desired, chip substitution is required.

One of the factors which enhances complexity of the module-building method is the large number of chips which are desired in a single module. In most of the development work, the number of stacked layers is 128. If 128 electrical leads are provided on the front plane end of each chip, the total number of leads on the front plane of the module will be $128 \times 128 = 16,384$.

Stacking 128 layers, and curing the epoxy between layers, in a single stack-building sequence creates extreme difficulties in maintaining tolerances in the Y-axis. In other words, a tolerance build-up can occur throughout the entire 128 layer series. One means of reducing tolerance problems would be to build completed sub-stacks, each having a smaller number of layers, and then combine the requisite number of sub-stacks to complete the full stack. For example, smaller cavity fixtures, FIGS. 13 to 17, might be used to stack and cure, say, sixteen chips; then, eight of those stacks could be stacked and cured to complete the 128 layer stack. With the sub-stacks, the tolerance of the lead locations in the stack can be held considerably tighter because of the fact that only a fraction of the total number of chips is subject to the possibility of tolerance build-up.

When the dry stacking measurements has been completed successfully, the next step is wet stacking. This involves spreading epoxy between the surfaces of adjacent chips. The amount of epoxy applied initially is substantially greater than that present in the final module. In other words, a large percentage of the epoxy is "squeezed out" during the final processing. However, wetting of the entire surface of each chip is vital. Air pockets between chips cannot be tolerated. So an excess of epoxy is purposely used, and then it is permitted to escape as necessary.

Figure 5A:
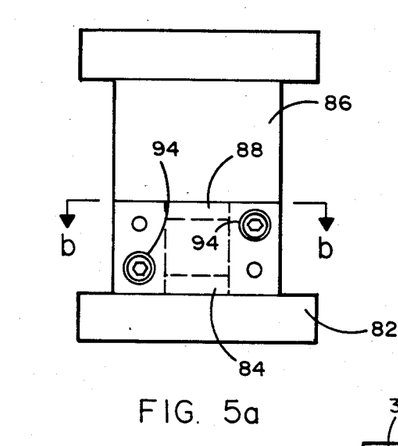
FIGS. 5A and 5B show the jaw sub-assembly of a fixture suitable for stacking the "wet" (i.e., epoxy-covered) chips, or substrates, prior to their insertion in the fixture of FIG. 3, FIG. 5A being a side elevation, and FIG. 5B being a cross-section on the line B—B of FIG. 5A.
Figure 5B:
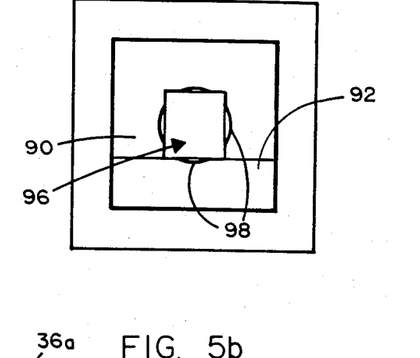

A second fixture, or apparatus, termed a "wet stacking" fixture, is used to accomplish stacking of the epoxy-covered chips, prior to insertion of the stack in the fixed cavity curing fixture, or apparatus. FIGS. 5A and 5B show the jaw sub-assembly of the wet stacking fixture, which is used to squeeze out excessive glue and to bring the Y-axis dimension to a height 1 to 2 mils greater than the final dimension. The jaw sub-assembly is inserted in a suitable press, after the wet chips have been stacked inside the jaw sub-assembly, which comprises (a) a lower jaw 82 having a raised, upwardly-projecting center portion 84 which supports the bottom of the stack, (b) an upper jaw 86 having a raised, downwardly-projecting center portion 88 which presses down on the top of the stack, and (c) side wall members 90 (U-shaped) and 92 (see FIG. 5B) secured together by suitable fastening members 94, and enclosing an essentially square (or rectangular) space 96 in which the stacked chips are confined. Grooves 98 are provided in each chip-facing wall of the wall members 90 and 92, for the purpose of draining epoxy. The epoxy remains liquid until its subsequent curing, so relative sliding motion of the chips is still possible in the wet stacking condition. Pressure, applied between chips 86 and 82, squeezes the stack to a dimension 1 to 2 mils greater than its final dimension.

Prior to stacking the chips between the jaws 82 and 86, they are cleaned, and epoxy is prepared and put in a metering syringe. A type of epoxy which has proved satisfactory is Epotek H377. The chips are then stacked one at a time, and after each chip is put in, a metered amount of epoxy is inserted on top of it. The epoxy is applied as a drop and then spread around with a tip of the syringe. During this period, the stack area 96 is open on two sides: on the top and on the vertical side later enclosed by wall member 92.

The same amount of epoxy is applied to the top of each chip. Because of the importance of complete wetting of the engaging surfaces of the chips, as mentioned above, the amount of epoxy is much greater than that which will remain in the final glue line. Provision is made for excess epoxy to escape from the chip into the fixture, both in the wet-stacking fixture, shown in FIGS. 5A and 5B, and in the final, fixed cavity shown in FIGS. 6 to 10.

The actual thickness of each glue line in the completed module should be in the range of 0.02 to 0.10 mil. This dimension is determined by subtracting the total thickness of the dry stacked chips, say 508 mils, from the Y-dimension of the fixed cavity, say 516 mils, and then dividing the difference (8 mils) by the number of glue lines (127 in a 128 chip module), which gives an average glue line thickness of approximately 0.06 mil.

After the wet stack has been completed, a small tool, which may be made of Teflon and have a shape similar to that of a tongue depressor, may be used to gently push the chips into the space 96. This provides some preliminary alignment of the chips. Then the wall member 92 is secured to the U-shaped wall member 90, leaving only the top of the stack open. The upper jaw 86 is then put into position, with its center portion 88 engaging the top of the stack. The jaw sub-assembly is then inserted in a suitable press (not shown), and pressure is applied between the upper and lower jaws 86 and 82 to compress the wet stack of chips. The pressure causes the upper jaw to move downward until its motion is stopped by engagement with the side walls 90 and 92.

The stack of chips containing the epoxy is now ready to be inserted in the final fixture, shown in FIGS. 6 to 10. As previously stated, it has been determined that the required tolerances in the completed module cannot be obtained without confining the stacked chips, during the epoxy curing process, in a cavity having a depth equal to the predetermined stack height of the completed module. In the X-axis, it is probably, but not necessarily, advantageous to have a fully closed, fixed dimension cavity.

In the fully closed version of the fixed cavity lamination fixture shown in FIGS. 6 to 10, six separate wall members are provided to enclose the stack when it is being cured in a suitable oven, preferably at a temperature in the range of 120°–150° C., for a period in the range of 1-3 hours. It is considered necessary that the wall members each be formed of material having a thermal coefficient of expansion similar to that of the chip material. As explained above, Kovar is a suitable wall material in a fixture which encloses a silicon chip stack. A stress-relieving process should be used in the fabrication of the Kovar wall members. They are first rough-machined, then raised to a very high temperature and returned to room temperature to relieve the stress. Thereafter, the Kovar wall members receive final machining to the very precise dimensions required.

Figure 6:
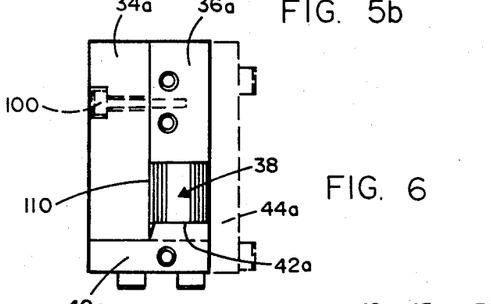
FIGS. 6-10 show the final, or "fixed cavity", lamination fixture, before insertion of the stacked layers, the figures showing, respectively, its top, end, bottom, left side, and right side, views.

The wall members of the fixed cavity fixture shown in FIGS. 6 to 10 correspond to those shown in FIG. 3. FIG. 6 may be considered a top view, FIG. 7 an end view, FIG. 8 a bottom view, and FIGS. 9 and 10 side views. This orientation is applied during assembling of the fixture; but preferably the end opposite to the end seen in FIG. 7 will be oriented downwards so that the chips will be horizontal during curing.

Figures 7, 10:
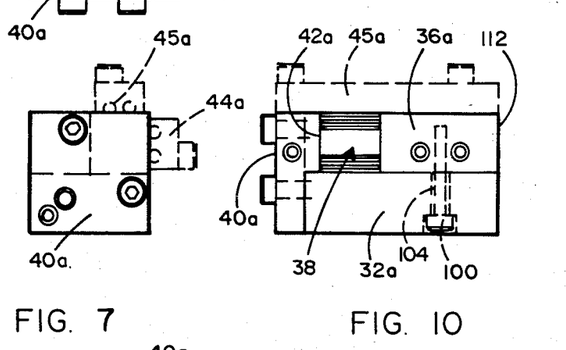
Figure 8:
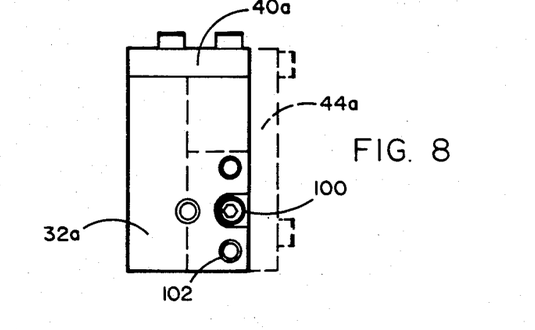
Figure 9:
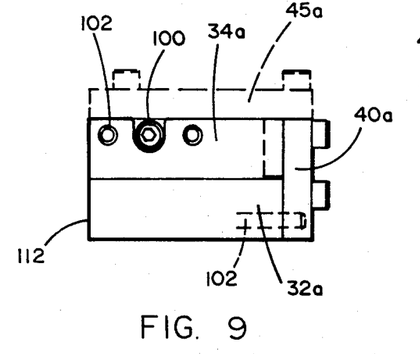

The platform wall member 32a, which is seen at the bottom of FIGS. 9 and 10, provides support for the longer block member 34a (FIG. 9) and for the shorter block member 36a (FIG. 10). As seen in the top view (FIG. 6) the mounting of members 34a and 36a on platform member 32a closes three sides of the cavity 38. Each member is secured to each adjoining member by at least one screw 100, after initial alignment by one or more dowel pins 102. The heads of the screws 100 need to be recessed in at least two outside surfaces of the fixture, both of which are used as bottom surfaces during the assembling procedure.

A problem encountered after curing the module is disassembling the fixture, due to the excess epoxy which is on the internal walls of the fixture. Removal necessitates the use of "back-off" screws, which are used to force apart adjacent cavity-forming members. For this purpose, each screw 100 extends through an enlarged threaded opening 104 in the near member, which it does not engage, into threaded engagement with a smaller threaded opening 106 in the far member. This permits a larger back-off screw to be threaded into the opening during disassembly of the fixture. The back-off screw, when it engages the far member, causes the near and far members to separate.

When the three members 32a, 34a and 36a have been secured to one another, the cavity 38 is closed on three sides, but remains open on three sides. As a primary means of facilitating removal of the stack from the fixture after curing, mold release material is used to cover thoroughly the interior of the cavity. A preferred procedure for ensuring effective application of mold release material includes the following steps: (a) clean the cavity; (b) heat the fixture (including unassembled wall members); (c) coat its entire interior (including unassembled wall members) with mold release material (brushed on); (d) dry the fixture; (e) reheat it; and (f) apply another coat of mold release material. After applying the mold release material, the wet stack of chips is removed from the wet stacking fixture (FIGS. 5A and 5B), and inserted into the cavity of the final fixture (after wiping off excess epoxy). With the cavity in the position shown in FIG. 10, the planes of the stacked chips will extend essentially vertically.

Alignment of the chips in the X-axis is accomplished by orienting the stacked chips in the cavity in such a way that: (a) their access plane edges (i.e., their electrical-lead-providing edges) are facing upwardly (as seen in FIG. 10), and (b) the sides of the chips are aligned against the cavity wall 110 provided by the longer block member 34a (see FIG. 6). Thus the plane of the module opposite the access plane rests on the platform member 32a. The X-alignment of the chips is ensured by pushing them individually against the wall 110, preferably using the same Teflon-coated tool which was used during wet stacking. Microscopic inspection is used to ensure that each chip is, in fact, in position against reference wall 110, by checking the interface between the chip and the wall. The importance of having the access plane facing upward during X-axis alignment is that it permits alignment to be checked at the access plane. If any other face of the module were used for X-axis alignment, slight variations in chip area dimensions could cause misalignment at the access plane. This would be unacceptable because subsequent connection of the access plane electrical leads to individual detectors, or other lead-out elements, requires holding very tight tolerances of the positions of the electrical leads.

Two or three cavity wall members remain unassembled at this point. The cap member 40a, whose raised surface 42a pushes against the stacked chips in a direction perpendicular to the planes of the chips, may already have been added to the fixture, but not tightened down to its final position. The other two cavity wall members are two side bar members 44a and 45a, which are shown in dashed lines in the figures.

Certain variations in the structure and assembling steps of the final fixture are feasible. It is possible to omit the final two walls, side bar members 44a and 45a. This is the case because, as stated, X-axis alignment is accomplished by using wall 110 as the reference surface. The cap member 40a is necessary, because it is responsible for establishing the total Y-axis dimension. Whether it is attached before or after the chip stack is inserted and aligned against wall 110 appears to be a matter of choice. However, it is not tightened down to reach its final position until X-axis alignment has been completed.

Assuming the use of the fifth and sixth walls, provided by side bar members 44a and 45a, the screws 100 which secure them to cap member 40a and block member 36a should extend through oversize holes in members 44a and 45a, in order to prevent damaging the stacked chips if they move relative to members 44a and 45a. Also, it is desirable that the screws 100 (see FIGS. 18 and 19) exert a resilient, rather than a rigid, retention pressure against side bar members 44a and 45a.

Figure 18:
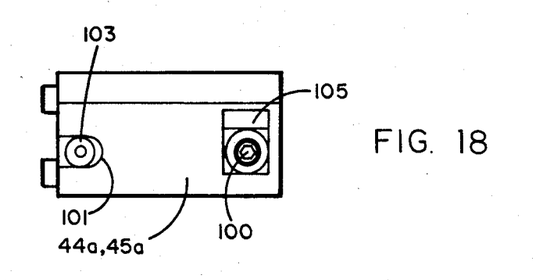
FIGS. 18 and 19 show a plan view and a side elevation, respectively, of the assembled fixture of FIGS. 6-10, in which spring clips are mounted between the screw heads and the side bar members.
Figure 19:
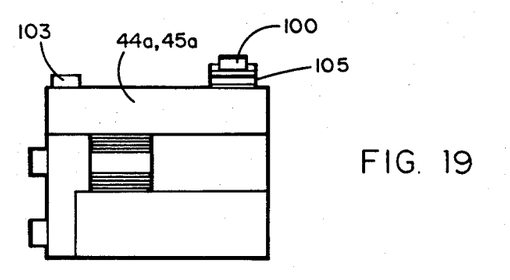

FIGS. 18 and 19 illustrate the preferred side bar retention arrangement. The screw 100 is shown in place at the right side of the figures, but is omitted at the left side of the figures. At the left side, an oversize hole 101, and a "standoff" member 103, are shown. At the right side, a spring clip 105 is shown, between the side bar member and the head of screw 100. The screw 100 is tightened down until it engages the standoff member 103. Thereafter, the spring clip 105 provides a resilient retention force against the side bar member.

The Kovar parts which enclose the fixed cavity 38 are carfully built to provide the exact dimensions desired. In preliminary assembly for measurement purposes, a certain level of torque is applied in tightening the screws 100. Development work has demonstrated that the desired dimensions of the cavity can be slightly altered if final assembly of the Kovar parts is performed using a different torque on the screws. Since correct dimensions of the cavity during curing are a vital requirement for success, it is considered important to use substantially the same screw-tightening torque during final assembly as that used during fabrication of the assembly parts by the machinist. It appears that the preferred tightening torque is about 17.6 inch-pounds, because that torque produces repeatable cavity dimensions.

When the cavity 38 and the inserted stack have been fully prepared, the entire assembly is placed in an oven, and heated at a temperature, and for a period, suitable for curing the epoxy, thereby providing a completed, integrated module. As stated above, a suitable temperature range for curing is 120° to 150° C. and a suitable period range is 1 to 3 hours. During curing, the fixture should be so oriented that the chip planes are substantially horizontal. In other words, the right end 112 of the fixture, as seen in FIG. 10 (or the left end, as seen in FIG. 9) would be the bottom surface during curing. The purpose of this orientation is to prevent non-uniform leakage of epoxy from its position between the chips.

Figure 11:
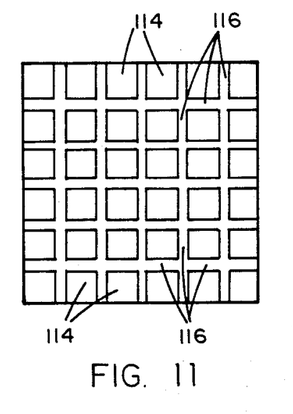
FIGS. 11 and 12 show the patterns and locations of grooves in the cavity walls which permit the escape of excess epoxy during the curing process.
Figure 12:
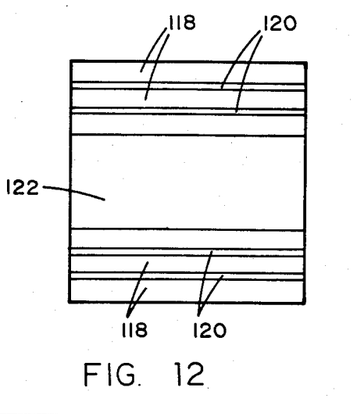
Figure 13:
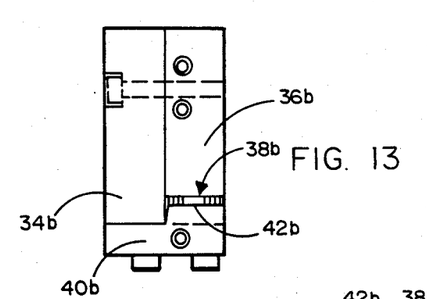
FIGS. 13-17 are views corresponding to those of FIGS. 6-10, except that they show a fixture designed for a "mini-stack" of layers, i.e., a reduced number of layers to be glued together as a partial stack prior to forming the full stack.
Figure 14:
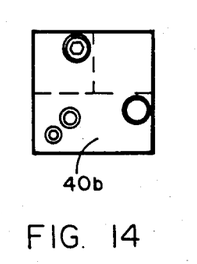
Figure 15:
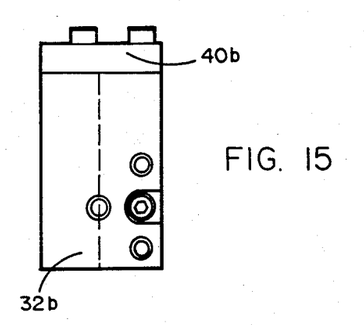
Figure 16:
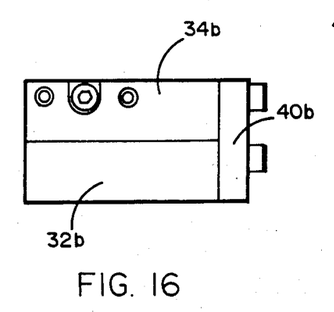
Figure 17:
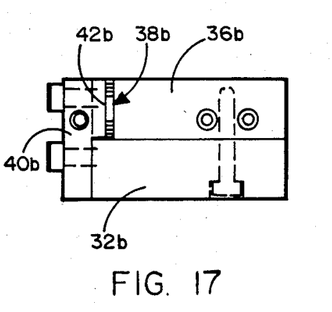

Since an excess of epoxy has been used to ensure complete coverage, some epoxy must be allowed to escape from the stack mounted in the the cavity. Otherwise, various problems might occur, e.g., creation of pressure tending to move the chips and thus distort the stack. Epoxy escape is facilitated by grooves in the walls of the cavity 38. FIGS. 11 and 12 show appropriate epoxy-draining grooves. FIG. 11 shows a "waffle" pattern, suitable for use at the top and bottom walls of the stack, i.e., walls extending in planes parallel to the chip planes, and being used to press the chips together. The flat chip surfaces of the end chips are supported on the raised "islands" 114. Epoxy is allowed to drain through the network of interconnecting grooves 116. FIG. 12 shows a pattern suitable for use in each of the four walls which engage edges of the stacked chips. Chip wall engagement is against longitudinally extending ridges 118. The remaining area is available for epoxy draining, including longitudinally extending grooves 120, and the entire recessed center portion 122.

Because of the difficulty encountered in disassembling the fixed cavity parts after curing the epoxy, it may be desirable to conduct the curing process in two steps. The first step would bring the cavity-enclosed stack to sufficient cohesion to prevent chip displacement. The stack would then be removed from the cavity, and the final curing would be accomplished with the stack as a free-standing unit.

As stated above, it may provide desirable to form a complete stack by first forming smaller stacks having fewer chips. FIGS. 13 to 17 show the wall members of a fixture used to provide a "mini-stack" containing 16 layers, instead of 128 layers. The wall-providing members in FIGS. 13 to 17 have the same numerals as corresponding members in previous figures, except that the suffix "b" has been used. Because the Y-axis dimension of the stack in FIGS. 13 to 17 is only one-eighth of the comparable dimension in FIGS. 6 to 10, the dimension of cavity 38b, between surface 42b (on cap member 40b) and the inner end of the shorter block member 36b, is one-eighth that of the cavity 38 in FIGS. 6 to 10. Also, the length of the shorter block member 36b is increased to fill the remaining seven-eighths of the cavity length. After the mini-stacks have been completed, several of them can then be stacked in a full-size cavity and secured together to form a full stack. This requires that the original epoxy be able to withstand two curing procedures, which has proved to be feasible.

From the foregoing description, it will be apparent that the apparatus and method disclosed in this application will provide the significant functional benefits summarized in the introductory portion of the specification. It will also be apparent that the principles of the present invention would be useful (a) with a variety of substrate materials, e.g., quartz or sapphire, and (b) in any situation requiring exact location of leads in both the X-axis and Y-axis of an access plane.

The following claims are intended not only to cover the specific embodiments disclosed, but also to cover the inventive concepts explained herein with the maximum breadth and comprehensiveness permitted by the prior art.

What is claimed is:

1. In the manufacturing of an electronic-circuitry-supporting stack of layers, each of which extends in a plane perpendicular to an access plane end at one end of the stack, and each of which provides a multiplicity of spaced electrical leads at the access plane, such leads being part of a two-dimensional planar array having its X-axis parallel to the layer planes and its Y-axis perpendicular to the layer planes, the method comprising:
    forming a plurality of substrate layers each having circuitry thereon providing at the access plane end a multiplicity of separate electrical leads spaced along the X-axis of the array;
    measuring the thickness of each layer;
    determining an order, based at least partially on the layer thickness measurements, in which to stack the layers so as to place the access plane electrical leads at their locations in the Y-axis of the array;
    fabricating a stack-confining structure which includes (a) lower and upper wall members having surfaces which will engage the lower and upper layers of the stack to determine the Y-axis dimension, and (b) a plurality of position reference elements perpendicular to said wall members adapted to determine the X-axis alignment of at least two sides of each of the layers;
    wet stacking the layers in the predetermined order after applying substantially the same amount of a liquid adhesive material between each pair of adjacent layers;
    placing the layers in the stack-confining structure supported on the lower wall member;
    aligning the layers along the X-axis by engaging them against the position reference elements of the stack-confining structure;
    using the upper and lower wall members of the stack-confining structure to exert pressure along the Y-axis causing the Y-axis dimension of the stack to correspond to the desired final dimension; and
    subjecting the confined stack to heat in order to cause the liquid adhesive to secure the layers in an integrated stack.

2. The method of claim 1 which also comprises:
    adding a plurality of additional position reference elements to the stack-confining structure after aligning the layers, thereby completely confining the stack in a fixed volume space during the heating step.

3. The method of claim 1 wherein the Y-axis dimension of the stack-confining structure is controlled by members having a thermal expansion coefficient approximating that of the layer material.

4. The method of claim 2 wherein the Y-axis dimension of the stack-confining structure is controlled by members having a thermal expansion coefficient approximating that of the layer material.

5. The method of claim 1 wherein:
    three sides of the stack-confining structure are first assembled, leaving the structure unconfined on three sides;
    the layers are then inserted in the structure with their access plane ends visible for alignment inspection;
    the layers are pushed along their X-axis into engagement against the reference element on one side; and
    X-axis alignment is checked by microscopic inspection of the access plane.

6. The method of claim 2 wherein:
    three sides of the stack-confining structure are first assembled, leaving the structure unconfined on three sides;
    the layers are then inserted in the structure with their access plane ends visible for alignment inspection;
    the layers are pushed along their X-axis into engagement against the reference element on one side; and
    X-axis alignment is checked by microscopic inspection of the access plane.

7. The method of claim 6 wherein:
    after X-axis alignment, the remaining three sides of the stack-confining structure are assembled; and
    one of the final three sides is caused to exert pressure on the stack along the Y-axis.

8. The method of claim 1 wherein:
    an excess amount of liquid adhesive material is used in order to prevent void areas between layers; and
    the excess liquid adhesive material is permitted to escape from the stack.

9. The method of claim 2 wherein:
    an excess amount of liquid adhesive material is used in order to prevent void areas between layers; and
    the excess liquid adhesive material is permitted to escape from the stack.

10. The method of claim 7 wherein:
    an excess amount of liquid adhesive material is used in order to prevent void areas between layers; and
    the excess liquid adhesive material is permitted to escape from the stack.

11. The method of claim 1 which also comprises:
    stacking a plurality of the multi-layer integrated stacks in a multi-stack combination;
    applying liquid adhesive material between adjacent stacks;
    supporting the multi-stack combination in a stack-confining structure;
    aligning the stacks in the X-axis;
    exerting pressure along the Y-axis to cause the Y-axis dimension to correspond to the desired final dimension; and
    subjecting the confined multi-stack combination to heat in order to cause the liquid adhesive to secure the stacks in an integrated combination of multi-layer stacks.

12. The method of claim 2 which also comprises:
    stacking a plurality of the multi-layer integrated stacks in a multi-stack combination;

applying liquid adhesive material between adjacent stacks;

supporting the multi-stack combination in a stack-confining structure;

aligning the stacks in the X-axis;

exerting pressure along the Y-axis to cause the Y-axis dimension to correspond to the desired final dimension; and subjecting the confined multi-stack combination to heat in order to cause the liquid adhesive to secure the stacks in an integrated combination of multi-layer stacks.

13. The method of claim 1 which also comprises:
applying mold release material to the layer-engaging surfaces of the stack-confining structure before the layers are placed in the structure.

14. The method of claim 2 which also comprises:
applying mold release material to the layer-engaging surfaces of the stack-confining structure before the layers are placed in the structure.

* * * * *